United States Patent
Chen et al.

(10) Patent No.: US 12,542,541 B2
(45) Date of Patent: Feb. 3, 2026

(54) CONTROL METHOD OF POWER SWITCH MODULE AND ASSOCIATED CIRCUIT

(71) Applicant: Faraday Technology Corp., Hsin-Chu (TW)

(72) Inventors: Wang-Chin Chen, Hsin-Chu (TW); Siang Yong Kevin Koh, Hsin-Chu (TW)

(73) Assignee: Faraday Technology Corp., Hsin-Chu (TW)

( * ) Notice: Subject to any disclaimer, the term of this patent is extended or adjusted under 35 U.S.C. 154(b) by 75 days.

(21) Appl. No.: 18/634,985

(22) Filed: Apr. 14, 2024

(65) Prior Publication Data
US 2025/0202459 A1   Jun. 19, 2025

(30) Foreign Application Priority Data

Dec. 19, 2023   (TW) .................................. 112149451

(51) Int. Cl.
| | | |
|---|---|---|
| H03K 17/00 | (2006.01) | |
| H03K 3/01 | (2006.01) | |
| H03K 17/56 | (2006.01) | |

(52) U.S. Cl.
CPC ............... *H03K 3/01* (2013.01); *H03K 17/56* (2013.01)

(58) Field of Classification Search
CPC ......... H03K 17/56; H03K 17/687; H03K 3/10
See application file for complete search history.

(56) References Cited

U.S. PATENT DOCUMENTS

| | | | | |
|---|---|---|---|---|
| 5,771,373 A | | 6/1998 | Kau | |
| 5,969,514 A | * | 10/1999 | Merrill | H02M 3/158 323/283 |
| 6,353,309 B1 | * | 3/2002 | Ootani | H03K 17/122 323/282 |
| 6,404,173 B1 | * | 6/2002 | Telefus | G05F 1/56 323/272 |
| 6,421,754 B1 | | 7/2002 | Kau | |
| 7,800,420 B2 | | 9/2010 | Kumar | |
| 8,710,917 B2 | * | 4/2014 | L'Hostis | H03K 19/0016 327/544 |
| 11,079,830 B2 | * | 8/2021 | Kulkarni | H02M 3/07 |
| 2009/0045677 A1 | * | 2/2009 | Frey | H03K 17/30 307/38 |
| 2011/0074472 A1 | * | 3/2011 | Kawasaki | H02J 1/10 327/143 |
| 2019/0386480 A1 | * | 12/2019 | Mourrier | H02H 3/08 |

FOREIGN PATENT DOCUMENTS

TW   I478494 B   3/2015

* cited by examiner

*Primary Examiner* — Tuan T Lam
(74) *Attorney, Agent, or Firm* — Winston Hsu

(57) ABSTRACT

The present invention provides a circuit including a logic circuit and a power switch module. The power switch module includes multiple switches, a voltage detection circuit and a control circuit. Each switch includes a control node, a first node and a second node, the first node is coupled to a supply voltage, the second node is coupled to the logic circuit; and the multiple switches comprise a first switch and multiple second switches, and the control node of the first switch receives a power enable signal. The voltage detection circuit is configured to detect whether a voltage of the second node of the first switch is greater than a reference voltage to generate a detection result. The control circuit is configured to generate an output power enable signal to the multiple second switches according to the detection result.

9 Claims, 6 Drawing Sheets

CONTROL METHOD OF POWER SWITCH MODULE AND ASSOCIATED CIRCUIT

BACKGROUND OF THE INVENTION

1. Field of the Invention

The present invention relates to a control method of a power switch module within a chip.

2. Description of the Prior Art

In a general chip, a power switch module is usually provided to connect a supply voltage to a logic circuit of the chip when it needs to be powered on. In addition, in order to provide sufficient current to the logic circuit, the power switch module includes multiple switches. However, when the power switch module receives a power enable signal and is enabled to connect the supply voltage to the logic circuit, a large amount of rush current may flow to the logic circuit from the supply voltage via the power switch module in a short period of time, causing a large instantaneous voltage drop in the supply voltage. Since the supply voltage may be supplied to other chips or other circuits at the same time, the instantaneous voltage drop of the supply voltage may affect the operation of other chips or other circuits.

In order to solve the above-mentioned instantaneous voltage drop problem of the supply voltage, the conventional art will set delay circuits between multiple switches in the power switch module. However, setting these delay circuits will not only increase the chip area, but also increase design cost of determining and calibrating the delay amount of the delay circuits.

SUMMARY OF THE INVENTION

Therefore, one of the objects of the present invention is to provide a control method for a power switch module, which can control the enabling time of multiple switches included in the power switch module to effectively reduce the rush current to avoid a large instantaneous voltage drop of the supply voltage, to solve the problem described in the prior art.

According to one embodiment of the present invention, a circuit comprising a logic circuit and a power switch module is disclosed. The power switch module comprises multiple switches, a voltage detection circuit and a control circuit. Each switch comprises a control node, a first node and a second node, the first node is coupled to a supply voltage, the second node is coupled to the logic circuit; and the multiple switches comprise a first switch and multiple second switches, and the control node of the first switch receives a power enable signal. The voltage detection circuit is coupled to the first switch of the multiple switches, and is configured to detect whether a voltage of the second node of the first switch is greater than a reference voltage to generate a detection result. The control circuit is coupled to the voltage detection circuit, and is configured to generate an output power enable signal to the multiple second switches according to the detection result.

According to one embodiment of the present invention, a control method of a power switch module is disclosed, wherein the power switch module comprises multiple switches, each switch comprises a control node, a first node and a second node, the first node is coupled to a supply voltage, and the second node is coupled to a logic circuit; and the multiple switches comprise a first switch and multiple second switches, and the control method comprises: inputting a power enable signal to the control node of the first switch; detecting whether a voltage of the second node of the first switch is greater than a reference voltage to generate a detection result; and generating an output power enable signal to the multiple second switches according to the detection result.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
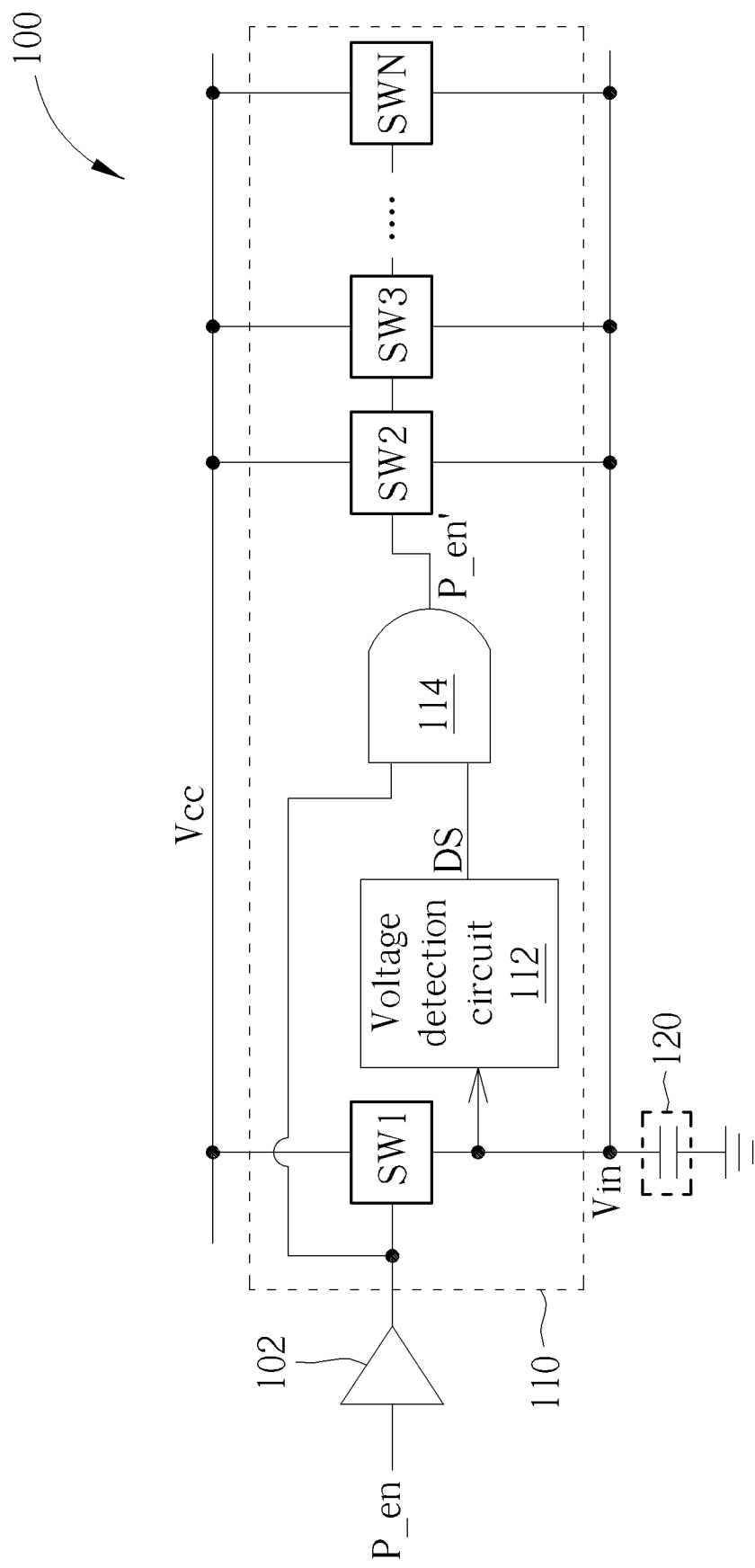
FIG. 1 is a diagram illustrating a circuit within a chip according a first embodiment of the present invention.

FIG. 1 is a diagram illustrating a circuit 100 within a chip according a first embodiment of the present invention. As shown in FIG. 1, the circuit 100 includes a buffer 102, a power switch module 110, and a logic circuit 120. The power switch module 110 includes multiple switches SW1-SWN, a voltage detection circuit 112 and a control circuit 114. In this embodiment, the logic circuit 120 is a core circuit of the chip or a circuit module having a specific function, and the power switch module 110 is used to selectively connect a supply voltage Vcc to the logic circuit 120, where the logic circuit 120 can be regarded as an equivalent capacitor from the perspective of the power supply.

In the operation of the power switch module 110, assuming that the logic circuit 120 does not work initially, for example, the logic circuit 120 operates in a sleep mode, a power enable signal P_en received by the power switch module 110 will have a first voltage level such as corresponding to a low voltage level of logical value "0", so that the multiple switches SW1-SWN are disabled. At this time, the logic circuit 120 is not connected to the supply voltage Vcc through the power switch module 110.

Then, when the logic circuit 120 needs to be powered on for operation, such as when it needs to enter a normal mode from the sleep mode, the power enable signal P_en will switch from the first voltage level to a second voltage level, for example, the second voltage level corresponds to the high voltage level of the logical value "1". At this time, the switch SW1 will be enabled so that the supply voltage Vcc starts to be connected to the logic circuit 120.

Figure 2:
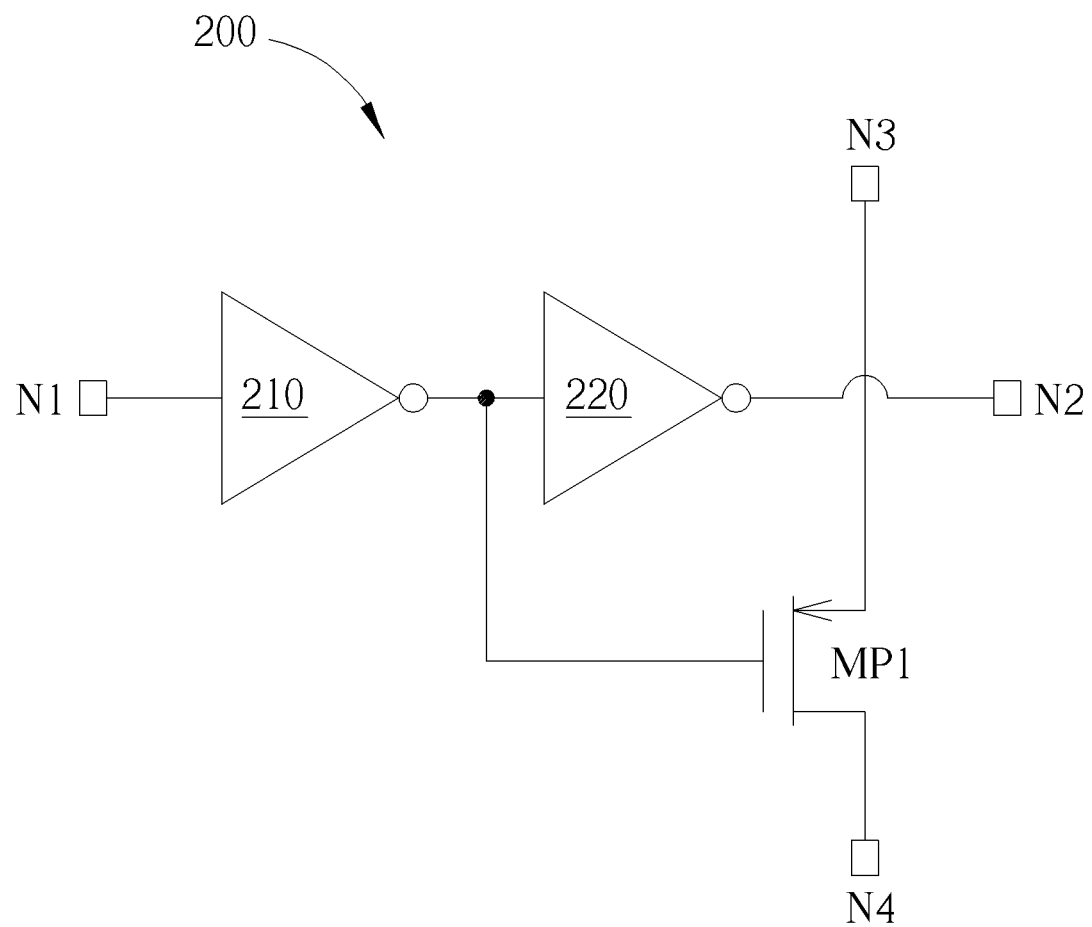
FIG. 2 is a switch according to one embodiment of the present invention.
Figure 3:
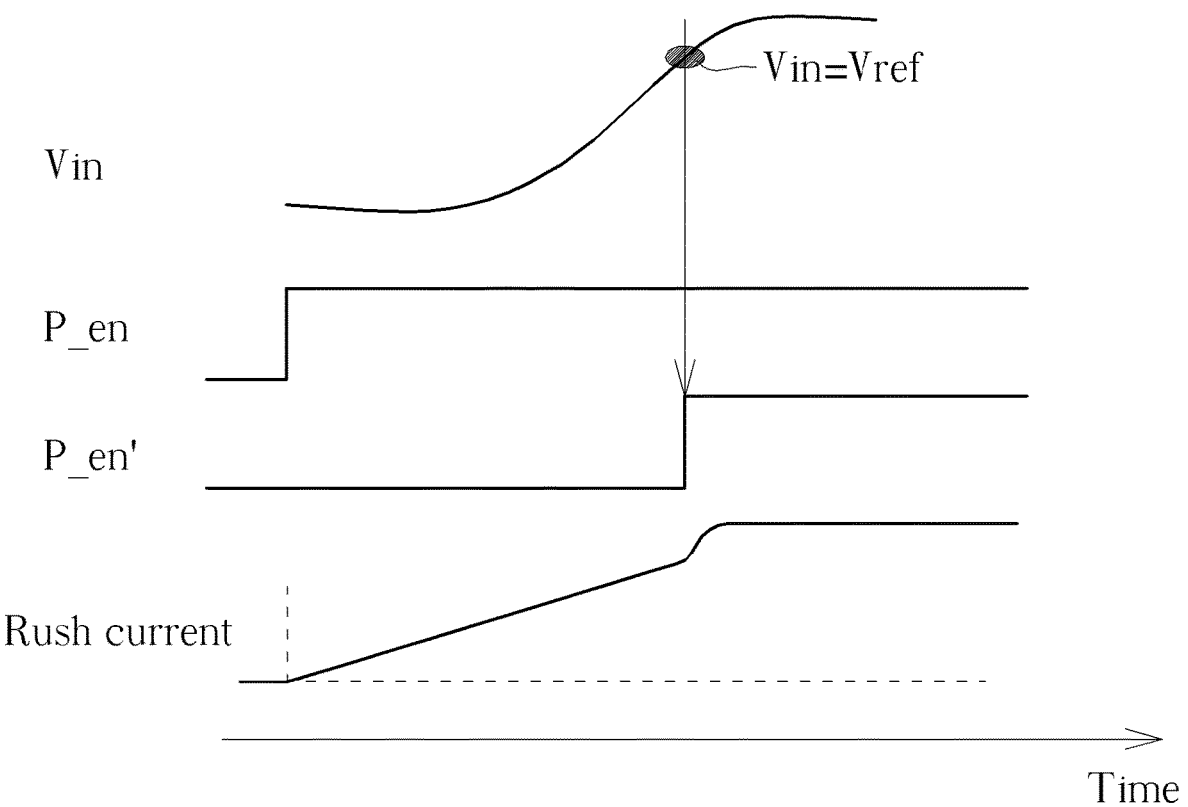
FIG. 3 is a timing diagram of multiple signals and a rush current according to one embodiment of the present invention.

FIG. 2 is a diagram of a switch 200 according to one embodiment of the present invention, wherein the switch 200 can be used to implement at least part of the switches SW1-SWN shown in FIG. 1. As shown in FIG. 2, the switch 200 includes two inverters 210 and 220, a P-type transistor MP1, and four terminals N1-N4, where the terminal N1 serves as an input terminal, the terminal N3 is coupled to the supply voltage Vcc, the terminal N4 is coupled to the logic circuit 120, and the terminal N2 can be designed to be an output terminal or a floating point. The signal from the terminal N1 is processed by the inverters 210 and 220 to generate an output signal to the terminal N2. The P-type transistor MP1 includes a control node, a first node and a second node, wherein the control node is connected to the output of the inverter 210, the first node is connected to the terminal N3, and the second node is connected to the terminal N4. Taking the switch SW1 as an example, the inverter 210 receives the power enable signal P_en through the buffer 102 to generate an inverted power enable signal, and the control node of the P-type transistor MP1 receives the inverted power enable signal to determine whether to conduct. Referring to FIG. 3, since the power enable signal P_en starts to enable the switch SW1, the second node of the P-type transistor MP1 will gradually increase the level of its voltage Vin due to the current from the supply voltage Vcc, wherein the voltage Vin can also be regarded as the voltage of an upper plate of the equivalent capacitance of the logic circuit 120. It is noted that, at this time, the other switches SW2-SWN are all disabled, and since only the switch SW1 is enabled at this time, the rush current is not high, and the voltage Vin rises slowly.

It should be noted that the use of two inverters 210, 220 and the P-type transistors to implement the switches SW1-SWN shown in FIG. 2 is only used as an example and is not a limitation of the present invention. In other embodiments, the switches SW1-SWN can be implemented using any other suitable circuit design.

The voltage detection circuit 112 detects the level of the voltage Vin to determine whether the voltage Vin is higher than a reference voltage Vref to generate a detection result DS. In one embodiment, the reference voltage Vref can be obtained by dividing the supply voltage Vcc through a voltage dividing circuit, and the reference voltage Vref can be any suitable value lower than the supply voltage Vcc, such as 0.75*Vcc, 0.8*Vcc, 0.85*Vcc, . . . , etc. In another embodiment, the reference voltage Vref is lower than the supply voltage Vcc, and when the voltage Vin is equal to or greater than the reference voltage Vref, the P-type transistors in the switches SW1-SWN will operate in the resistance region instead of the saturation region.

In one embodiment, the voltage detection circuit 112 may be a comparator, and the voltage detection circuit 112 compares the voltage Vin and the reference voltage Vref to generate the detection result DS. In this embodiment, if the voltage Vin is lower than the reference voltage Vref, the detection result DS is a low voltage level corresponding to the logical value "0"; and if the voltage Vin is higher than the reference voltage Vref, the detection result DS has the high voltage level corresponding to the logical value "1", but the present invention is not limited to this.

Then, the control circuit 114 receives at least the detection result DS to generate an output power enable signal P_en' to the switches SW2-SWN. In one embodiment, if the detection result DS indicates that the voltage Vin is lower than the reference voltage Vref, the output power enable signal P_en' disables the switches SW2-SWN; and if the detection result DS indicates that the voltage Vin is higher than the reference voltage Vref, the output power enable signal P_en' will enable the switches SW2-SWN. In another embodiment, in order to prevent the power switch module 110 from malfunctioning due to voltage instability during operation, the control circuit 114 generates the output power enable signal P_en' to the switches SW2 SWN based on the power enable signal P_en and the detection result DS. For example, only when the detection result DS indicates that the voltage Vin is higher than the reference voltage Vref, and the power enable signal P_en has a voltage level used to enable the power switch module 110 (for example, corresponding to the logical value "1"), the output power enable signal P_en' will enable the switches SW2-SWN. It is noted that the power enable signal P_en received by the control circuit 114 may come from the terminal N1 or the terminal N4 of the switch 200 shown in FIG. 2.

In the embodiment of FIG. 1, the control circuit 114 is implemented by using an AND gate, but this feature is not a limitation of the present invention.

Specifically, as long as when the detection result DS indicates that the voltage Vin is higher than the reference voltage Vref and the power enable signal P_en has a voltage level used to enable the power switch module 110, the control circuit 114 can generate the output power enable signal P_en' to enable the switches SW2-SWN, and the control circuit 114 can be implemented by 6 using other different logical circuits.

In addition, the voltage Vin already has a higher voltage level when the switches SW2-SWN are enabled (that is, the voltage Vin is higher than the reference voltage Vref). Therefore, since there is a small voltage difference between the first node and the second node of each switch, the switches SW2-SWN will operate in the resistive region because the voltage difference between the drain and the source (i.e., Vds) is less than the threshold value, and have smaller amount of current.

As described in the above embodiments, and referring to FIG. 3, when the power enable signal P_en starts to enable the power switch module 110, only the switch SW1 will be enabled at the beginning to charge the equivalent capacitance of the logic circuit 120, so it will have a lower rush current, and the voltage Vin will rise slowly. In addition, when the level of voltage Vin is higher than the reference voltage Vref, the control circuit 114 will enable the remaining switches SW2-SWN to charge the equivalent capacitance of the logic circuit 120, and since the switches SW2-SWN have a smaller current amount because they operate in the resistive region, a large instantaneous voltage drop in the supply voltage Vcc caused by a large rush current can be further avoided.

Figure 4:
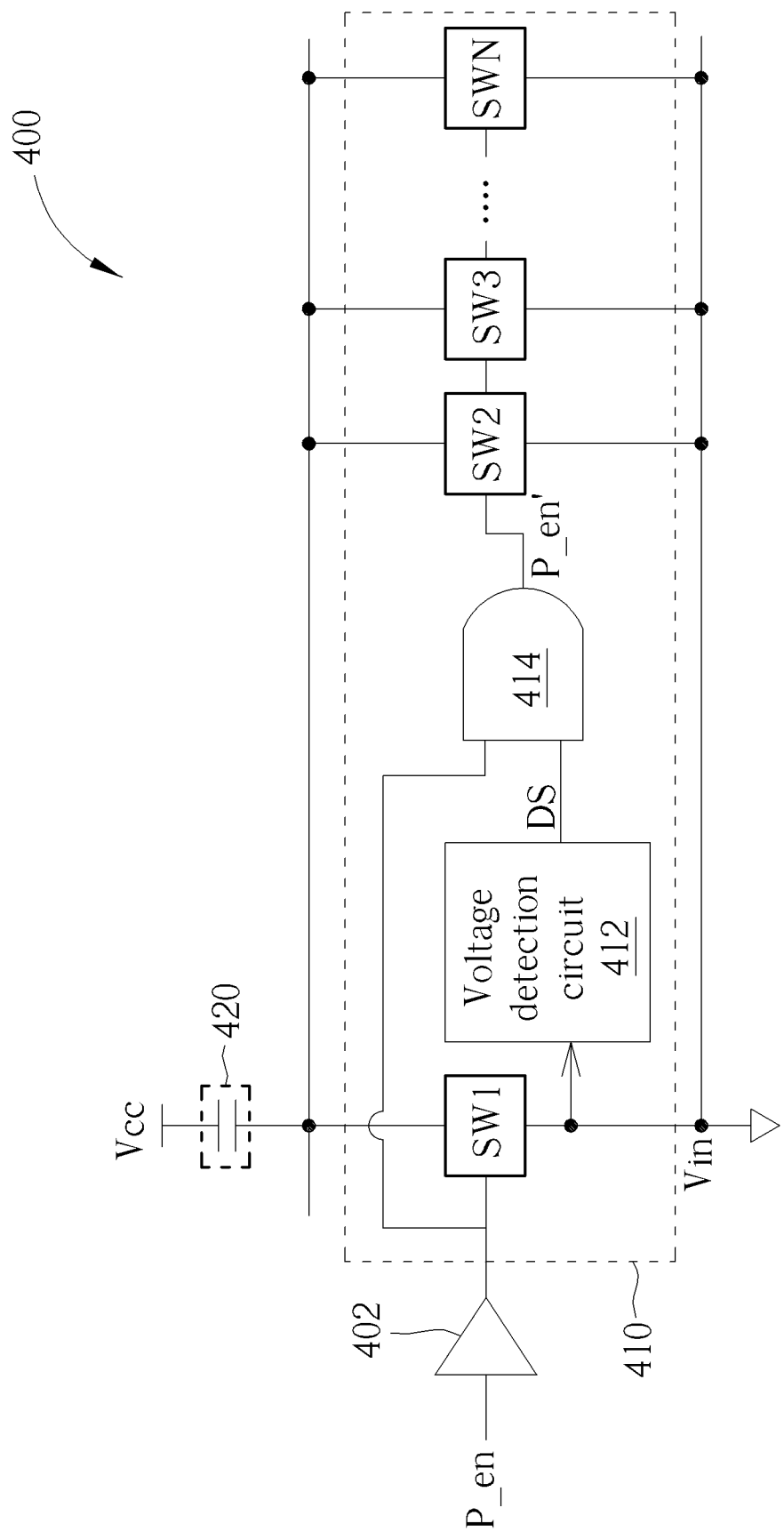
FIG. 4 is a diagram illustrating a circuit within a chip according a second embodiment of the present invention.

FIG. 4 is a diagram illustrating a circuit 400 within a chip according a second embodiment of the present invention. As shown in FIG. 4, the circuit 400 includes a buffer 402, a power switch module 410, and a logic circuit 420. The power switch module 410 includes multiple switches SW1-SWN, a voltage detection circuit 412 and a control circuit 414. In this embodiment, the logic circuit 420 can be regarded as an equivalent capacitor from the perspective of the power supply.

Figure 5:
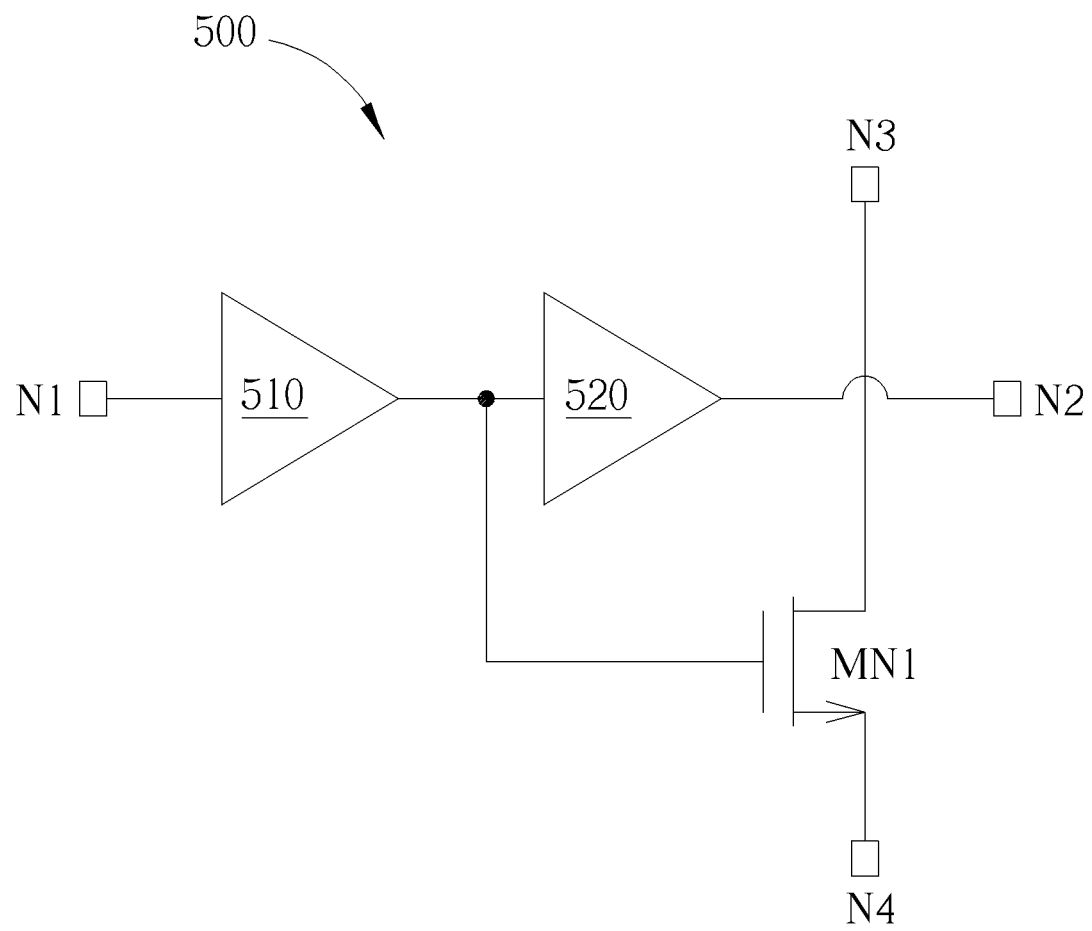
FIG. 5 is a switch according to one embodiment of the present invention.

FIG. 5 is a diagram of a switch 500 according to one embodiment of the present invention, wherein the switch 500 can be used to implement at least part of the switches SW1-SWN shown in FIG. 4. As shown in FIG. 5, the switch 500 includes two buffers 510 and 520, an N-type transistor MN1, and four terminals N1-N4, where the terminal N1 serves as an input terminal, the terminal N3 is coupled to the logic circuit 420, the terminal N4 is coupled to a reference terminal, and the terminal N2 can be designed to be an output terminal or a floating point. The signal from the terminal N1 is processed by the buffers 510 and 520 to generate an output signal to the terminal N2. The N-type transistor MN1 includes a control node, a first node and a second node, wherein the control node is connected to the output of the buffer 510, the first node is connected to the terminal N3, and the second node is connected to the terminal N4. Taking the switch SW1 as an example, the buffer 510 receives the power enable signal P_en to control the control node of the N-type transistor MN1 to determine if enabling the N-type transistor MN1.

The operations of the embodiments in FIG. 4 and FIG. 5 are similar to the embodiments in FIG. 1 and FIG. 2. A person skilled in the art should be able to understand the operations after reading the above embodiments, so the details are omitted here.

Figure 6:
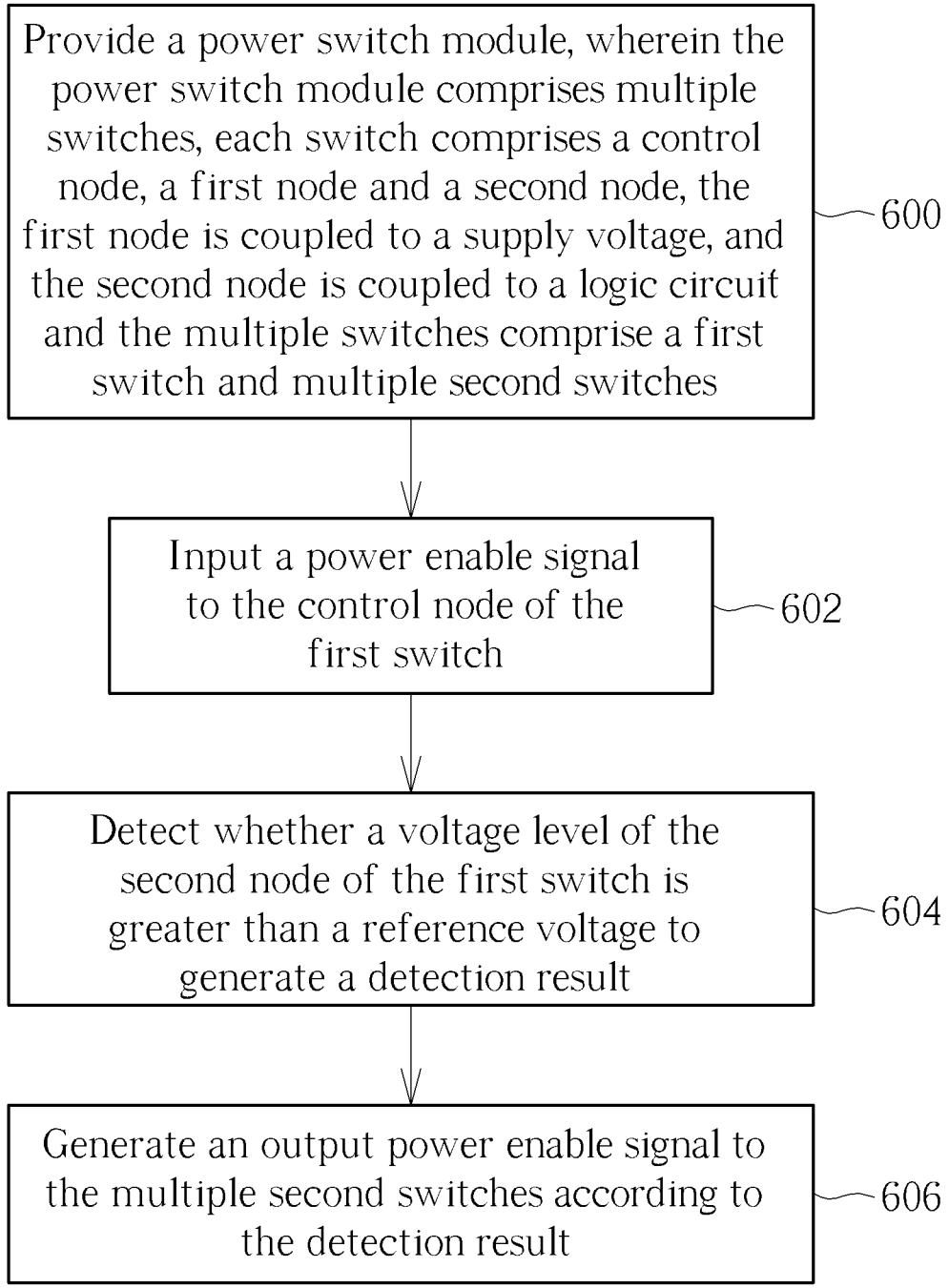
FIG. 6 is a flowchart of a control method of a power switch module according to one embodiment of the present invention.

FIG. 6 is a flowchart of a control method of a power switch module 110/410 according to one embodiment of the present invention. Referring to the above embodiments together, the flow of the control method is described as follows.

Step 600: Provide a power switch module, wherein the power switch module comprises multiple switches, each switch comprises a control node, a first node and a second node, the first node is coupled to a supply voltage, and the second node is coupled to a logic circuit; and the multiple switches comprise a first switch and multiple second switches.

Step 602: Input a power enable signal to the control node of the first switch.

Step 604: Detect whether a voltage level of the second node of the first switch is greater than a reference voltage to generate a detection result.

Step 606: Generate an output power enable signal to the multiple second switches according to the detection result.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A circuit, comprising:
a logic circuit; and
a power switch module, coupled to the logic circuit, wherein the power switch module comprises:
multiple switches, wherein each switch comprises a control node, a first node and a second node, the first node is coupled to a supply voltage, the second node is coupled to the logic circuit; and the multiple switches comprise a first switch and multiple second switches, and the control node of the first switch receives a power enable signal;
a voltage detection circuit, coupled to the first switch of the multiple switches, configured to detect whether a voltage of the second node of the first switch is greater than a reference voltage to generate a detection result; and
a control circuit, coupled to the voltage detection circuit, configured to generate an output power enable signal to the multiple second switches according to the detection result;
wherein the control circuit receives the power enable signal inputted into the control node of the first switch and the detection result to generate the output power enable signal to the multiple second switches.

2. The circuit of claim 1, wherein when the detection result indicates that the voltage of the second node of the first switch is lower than the reference voltage, the multiple second switches are disabled; and when the detection result indicates that the voltage of the second node of the first switch is greater than the reference voltage, the control circuit generates the output power enable signal to enable the multiple second switches.

3. The circuit of claim 1, wherein only when the detection result indicates that the voltage of the second node of the first switch is greater than the reference voltage, and the power enable signal has a voltage level used to enable the first switch, the control circuit generates the output power enable signal to enable the multiple second switches.

4. The circuit of claim 1, wherein the control circuit is an AND gate.

5. The circuit of claim 1, wherein each of the multiple switches comprises a transistor; and the reference voltage is lower than the supply voltage, and when the voltage is equal to or greater than the reference voltage, all the transistors in the second switches operate in a resistance region.

6. A control method of a power switch module, wherein the power switch module comprises multiple switches, each switch comprises a control node, a first node and a second node, the first node is coupled to a supply voltage, and the second node is coupled to a logic circuit; and the multiple switches comprise a first switch and multiple second switches, and the control method comprises:
inputting a power enable signal to the control node of the first switch;
detecting whether a voltage of the second node of the first switch is greater than a reference voltage to generate a detection result; and
generating an output power enable signal to the multiple second switches according to the detection result;
wherein the step of generating the output power enable signal to the multiple second switches according to the detection result comprises:
receiving the power enable signal inputted into the control node of the first switch and the detection result, by a control circuit, to generate the output power enable signal to the multiple second switches.

7. The control method of claim 6, wherein the step of generating the output power enable signal to the multiple second switches according to the detection result comprises:
when the detection result indicates that the voltage of the second node of the first switch is lower than the reference voltage, the multiple second switches are disabled; and
when the detection result indicates that the voltage of the second node of the first switch is greater than the reference voltage, generating the output power enable signal to enable the multiple second switches.

8. The control method of claim 6, wherein the step of generating the output power enable signal to the multiple second switches according to the detection result and the power enable signal comprises:
only when the detection result indicates that the voltage of the second node of the first switch is greater than the reference voltage, and the power enable signal has a voltage level used to enable the first switch, generating the output power enable signal to enable the multiple second switches.

9. The control method of claim 6, wherein each of the multiple switches comprises a transistor; and the reference voltage is lower than the supply voltage, and when the voltage is equal to or greater than the reference voltage, all the transistors in the second switches operate in a resistance region.

* * * * *